United States Patent [19]

Matsuda et al.

[11] Patent Number: 4,918,514

[45] Date of Patent: Apr. 17, 1990

[54] PRESS-CONTACT TYPE SEMICONDUCTOR DEVICE

[75] Inventors: Hideo Matsuda; Yasunori Usui, both of Yokohama; Shinjiro Kojima, Chigasaki; Masaru Ando, Kamakura, all of Japan

[73] Assignee: Kabushiki Kaisha Toshiba, Kawasaki, Japan

[21] Appl. No.: 173,458

[22] Filed: Mar. 25, 1988

[30] Foreign Application Priority Data

Mar. 31, 1987 [JP] Japan ................................ 62-78653

[51] Int. Cl.$^4$ ...................... H01L 23/42; H01L 23/44; H01L 23/46
[52] U.S. Cl. .......................... 357/79; 357/71; 357/74; 357/81; 357/56
[58] Field of Search ...................... 357/79, 71, 74, 81, 357/56

[56] References Cited

U.S. PATENT DOCUMENTS

| | | | |
|---|---|---|---|
| 4,246,596 | 1/1981 | Iwasaki | 357/79 |
| 4,618,877 | 10/1986 | Araki et al. | 357/79 |
| 4,724,475 | 2/1988 | Matsuda | 357/79 |

FOREIGN PATENT DOCUMENTS 0064231 11/1982 European Pat. Off. .............. 357/75

*Primary Examiner*—Rolf Hille
*Assistant Examiner*—Hoanganh Le
*Attorney, Agent, or Firm*—Finnegan, Henderson, Farabow, Garrett and Dunner

[57] ABSTRACT

A soft metal plate having substantially equal hardness as emitter electrodes formed of soft metal is disposed between the emitter electrodes and a heat buffer metal plate formed of hard metal, and pressure applied to the emitter electrodes is shared by the soft metal plate, so as to reduce the thermal fatigue of the emitter electrodes.

18 Claims, 4 Drawing Sheets

PRESS-CONTACT TYPE SEMICONDUCTOR DEVICE

BACKGROUND OF THE INVENTION

1. Field of the Invention

This invention relates to a press-contact type semiconductor device which is used with semiconductor elements sandwiched between electrodes to which external force is applied, and more particularly, to a semiconductor device such as a mesa transistor, a gate turn-off thyristor, and a high-speed thyristor in which main and control electrodes are interlaced with each other.

2. Description of the Related Art

Because it possesses a high electrical conductivity, aluminum is generally used to form wirings and electrodes of semiconductor devices. However, since aluminum is a soft metal, it is not always best suited for high-power press-contact type semiconductor devices. This is because the semiconductor element of this type of semiconductor device is pressed with a higher pressure, since such a semiconductor device is formed to have a higher power. The term "press-contact" used in this specification means that two things can be brought into contact together simply by pressing them against each other, using a high pressure. Assume that the semiconductor element is a power transistor having a diameter of 40 mm. In this case, the emitter and base electrodes of the transistor are formed of aluminum layers of a thickness of, for example, 10 $\mu$m. The emitter and base electrodes are alternately arranged at intervals of approx. 200 to 300 $\mu$m, with each of the emitter electrodes being formed at a position higher by 20 $\mu$m with respect to that of each of the base electrodes. The power transistor is sandwiched between external electrodes of copper and press-contact with the external electrodes under a pressure of 1.0 to 1.5 tons. A heat buffer plate is placed between the emitter and each of the base electrodes of the power transistor and the external electrodes.

Even if the heat buffer plate of the above-described power semiconductor device is inserted between the emitter electrode and the external electrode, the emitter electrode will undergo thermal fatigue after it has been subjected to heat cycle due to repetitive switching operations, for example. Since thermal fatigue may cause the emitter electrode to be put out transversely, with the possibility that it will come into contact with the base electrode, therefore the emitter and base electrodes are set in contact with each other, making part of the semiconductor device defective. As thermal fatigue increases, the heat buffer plate is press-contact with the semiconductor substrate on which the semiconductor element is formed by means of the emitter electrode. If, in this condition, the heat buffer plate is subjected to thermal expansion, this may cause the semiconductor substrate to crack due to stretching.

Cracking of the semiconductor substrate, as well as short circuiting between the emitter and base electrodes, can be prevented by using metal which is as soft as aluminum to form the heat buffer plate. However, when the heat buffer plate is formed of soft metal, there is a possibility that the external electrodes may be deformed when the semiconductor element is press-contact, making it impossible to apply a uniform pressure to the semiconductor element. Thus, it becomes difficult to control the pressure applied to the semiconductor element by means of the external electrodes.

As has been described above, thermal fatigue of the electrode of the prior art press-contact type semiconductor device occurs when the electrode is subjected to heat cycle caused by repetitive switching operations, which causes short-circuiting of the emitter and the base electrodes and cracks in the semiconductor substrate.

SUMMARY OF THE INVENTION

An object of this invention is to provide a press-contact type semiconductor device in which defects due to the thermal fatigue of electrodes of semiconductor elements to be press-contacted can be effectively prevented.

The object can be achieved by a press-contact type semiconductor device comprising a semiconductor element of mesa structure; a casing in which the semiconductor element is arranged; external electrodes arranged to sandwich and press-contact the semiconductor element placed in the casing; and a composite plate of soft and hard metal plates disposed between the external electrode and the semiconductor element.

With this construction, since the soft and hard metal plates are disposed between the soft metal electrode of the semiconductor device and the external electrode, the pressure applied to the electrode of the semiconductor device can be shared by the soft metal plate. Therefore, deformation of the extraction electrode of the semiconductor element can be made small. Further, use of the hard metal plate can prevent deformation of the external electrode which will be caused at the time of press-contacting the semiconductor element by use of the soft metal plate. Thus, a press-contact type semiconductor device can be obtained in which the thermal fatigue of the electrode of the semiconductor element can be suppressed and defects due to the thermal fatigue can be prevented.

DETAILED DESCRIPTION OF THE PREFERRED EMBODIMENT

Figure 1:
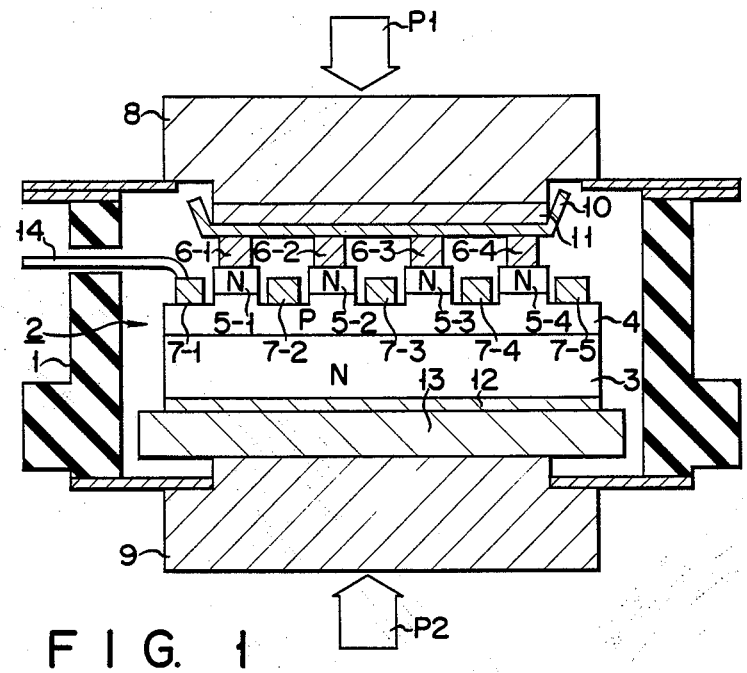
FIG. 1 is a cross sectional view of a press-contact type semiconductor device according to one embodiment of this invention.

FIG. 1 is a cross sectional view of a press-contact type semiconductor device according to one embodiment of this invention. In the embodiment of FIG. 1, flat type power transistor is provided as an example of the press-contact type semiconductor device. In ceramic casing 1, NPN transistor element 2 is provided. Element 2 has base region 4 of P-type impurity region formed on N-type silicon substrate 3 acting as a collector region. Emitter regions 5-1 to 5-4 of N-type impurity regions are formed on base region 4. Emitter regions 5-1 to 5-4 are formed with mesa structure. Emitter electrodes 6-1 to 6-4 are formed on emitter regions 5-1 to 5-4. Base electrodes 7-1 to 7-5 are formed on base region 4. Base electrodes 7-1 to 7-5 and emitter electrodes 6-1 to 6-4 are alternately arranged. Emitter electrodes 6-1 to 6-4 and base electrodes 7-1 to 7-5 are formed of soft metal such as aluminum, for example. Transistor element 2 is press-contact with external electrodes 8 and 9 of copper by pressure applied in a direction shown by arrows P1 and P2 in FIG. 1. Emitter electrodes 6-1 to 6-4 of element 2 are pressed against soft metal plate 10 formed of silver (Ag), aluminum (Al) or copper (Cu) via heat buffer plate 11 formed of hard metal such as molybdenum (Mo) or tungsten (W) by means of external electrode 8. It is desirable that soft metal plate 10 be made of a metal having a Vickers hardness which ranges from 0.3 times to 1.5 times the Vickers hardness of the material of emitter electrodes 6-1 and 6-2. Hence, plate 10 can be made of a metal harder than the metal forming emitter electrodes 6-1 to 6-4. Silver has Vickers hardness of 27.29; copper has Vickers hardness of 43.96; aluminum has Vickers hardness of 82.01 (the aluminum formed on the silicon substrate has Vickers hardness of about 60); molybdenum has Vickers hardness of 279.2; and tungsten has Vickers hardness of 446.6. Therefore, as has been described when emitter electrodes 6-1 to 6-4 are made of aluminum, plate 10 can be made of silver, copper, or aluminum, and cannot be made of molybudenum or tungsten. When electrodes 6-1 to 6-4 are made of aluminum vapor-deposited on the silicon substrate, it is desirable that plate 10 be made of a metal whose Vickers hardness is twice of less the Vickers hardness of this aluminum. Substrate 3 of transistor element 2 is connected to external electrode 9 via fusible metal layer 12 such as solder and heat buffer plate 13. Heat buffer plate 13 is formed of the same material as heat buffer plate 11. Lead wire 14 is connected to base electrode 7-1 of transistor element 2 and formed to extend externally from outer casing 1. Base electrodes 7-1 to 7-5 appear to be formed separately from each other in the cross sectional view of FIG. 1, but they are actually connected to each other on substantially the same plane.

The thickness of emitter electrodes 6-1 to 6-4 and base electrodes 7-1 to 7-5 is set to 10 to 15 $\mu$m, the thickness of soft metal plate 10 is set to 50 to 200 $\mu$m, and the thickness of heat buffer plate 11 is set to 400 $\mu$m to 1 mm.

Figure 2:
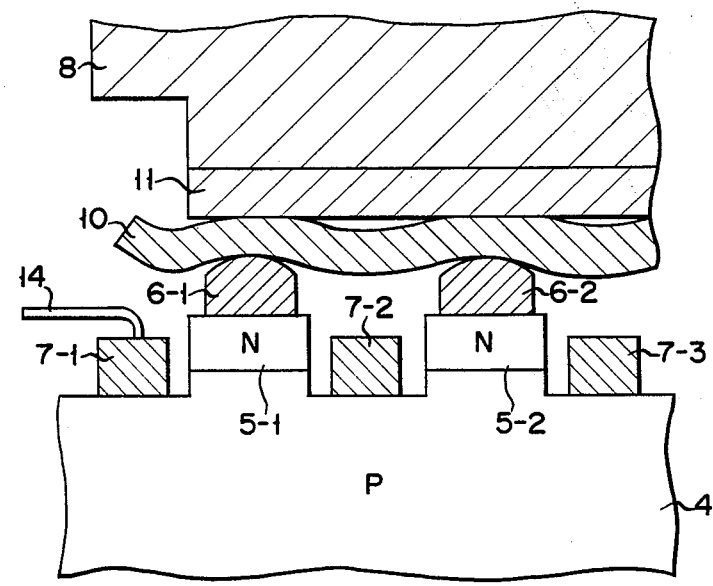
FIG. 2 is a cross sectional view of an enlarged portion mainly showing the emitter electrode of an NPN transistor element in the device of FIG. 1.

With this construction, since soft metal plate 10 having substantially equal hardness as emitter electrodes 6-1 to 6-4 is placed between hard heat buffer plate 11 and soft emitter electrodes 6-1 to 6-4, a pressure to be applied to emitter electrodes 6-1 to 6-4 when transistor element 2 is press-contact by means of external electrode 9 can be shared with soft metal plate 10 as clearly shown in FIG. 2. That is, soft metal plate 10 is deformed at the time of press-contacting of transistor element 2, and it absorbs part of pressure to be applied to emitter electrodes 6-1 to 6-4, causing emitter electrodes 6-1 to 6-4 to be less deformed. Further, the presence of soft metal plate 10 causes emitter electrodes 6-1 to 6-4 to be deformed so as to have a round upper surface at the time of press-contacting, and emitter electrodes 6-1 to 6-4 will not be put out transversely. In addition, since heat buffer plate 11 formed of hard metal is placed between soft metal plate 10 and external electrode 8, deformation of external electrode 8 caused at the time of press-contacting due to the use of soft metal plate 10 can be prevented. Thus, it is possible to prevent short circuit between emitter electrodes 6-1 to 6-4 and base electrodes 7-1 to 7-5 and formation of crack in substrate 3, and makes it unnecessary to effect troublesome pressure control caused by deformation of external electrode 8.

Figure 3:
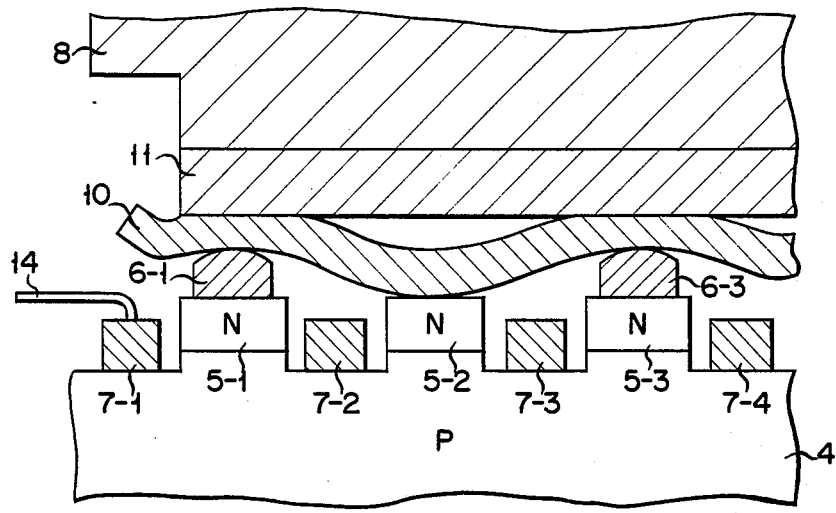
FIG. 3 is a cross sectional view for illustration of a problem which may occur when the device of the structure shown in FIG. 1 is used.

In transistor element 2 as described above, when part of element 2 is defective, an emitter electrode corresponding to the defective portion is removed. However, if the emitter electrode 6-2 corresponding to the defective portion is removed as shown in FIG. 3, the distance of emitter electrode 6-1 from the adjacent emitter electrode, in this example, emitter electrode 6-3 becomes large, and soft metal plate 10 may be largely curved. In the case where soft metal plate 10 is largely curved, soft metal plate 10 may be brought into contact with emitter region 5-2 corresponding to the removed emitter electrode. When such a defect occurs, the defective portion will affect the operation of transistor element 2, thus causing the press-contact semiconductor device itself to be defective.

Figure 4:
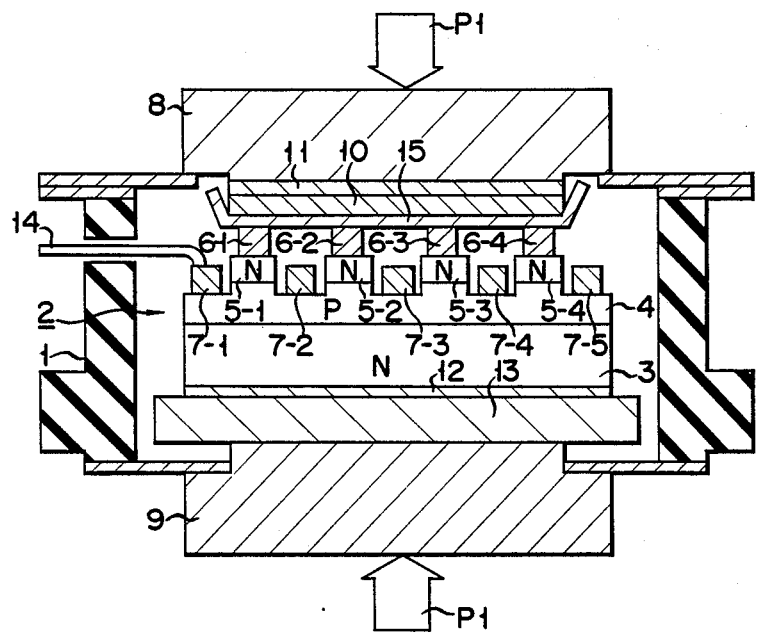
FIG. 4 is a cross sectional view of a device of one example obtained by modifying the device of FIG. 1 so as to solve the problem indicated in FIG. 3.

In order to prevent the aforementioned defect, heat buffer plate 15 formed of hard metal such as molybdenum (Mo) or tungsten (W), soft metal plate 10 formed of aluminum (Al), silver (Ag), copper (Cu) or the like and hard metal plate 11 formed of molybdenum (Mo), tungsten (W) or the like are arranged between emitter electrodes 6-1 to 6-4 and external electrode 8 as shown in FIG. 4. In this case, the thickness of heat buffer plate 15 is set to 50 $\mu$m, the thickness of soft metal plate 10 is set to 100 $\mu$m and thickness of hard metal plate 11 is set to 400 $\mu$m.

Figure 5:
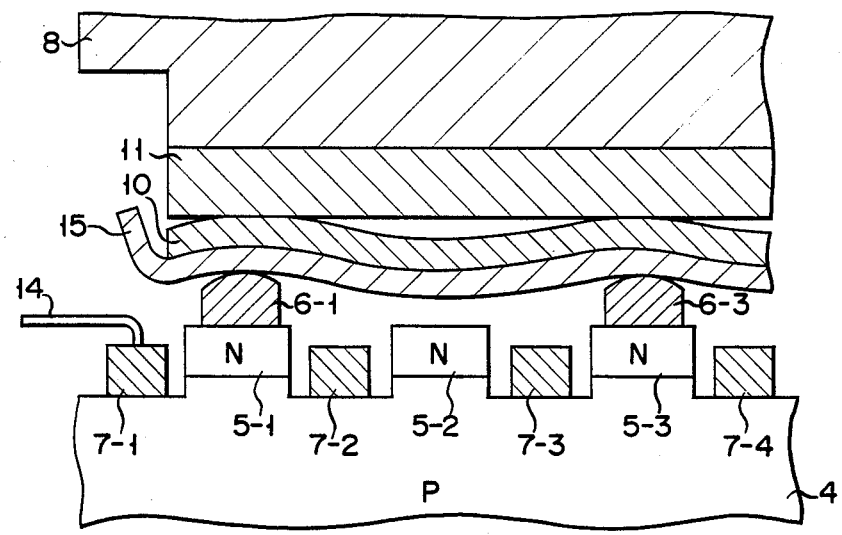
FIG. 5 is a cross sectional view of an enlarged portion mainly showing the emitter electrode of an NPN transistor element in the device of FIG. 4.

With this construction, since soft metal plate 10 is sandwiched between hard metal plates 11 and 15, the degree of curve of soft metal plate 10 can be suppressed by hard heat buffer plate 15. Therefore, even if the distance between adjacent electrodes becomes large by elimination of emitter electrode 6-2 at the defective portion, soft metal plate (heat buffer plate in the case of FIG. 5) will not be brought into contact with emitter region 5-2. In this case, hard heat buffer plate 15 is set in contact with emitter electrodes 6-1, 6-3, . . . However, heat buffer metal plate 15 is formed thin as described before so as to be slightly deformed together with soft metal plate 10 at the time of press-contacting. Therefore, even if the emitter electrode is put out transversely when the pressure is applied to external electrodes 8 and 9, emitter electrodes 6-1, 6-3, . . . will not be short-circuited with base electrodes 7-1 to 7-5.

Figure 6:
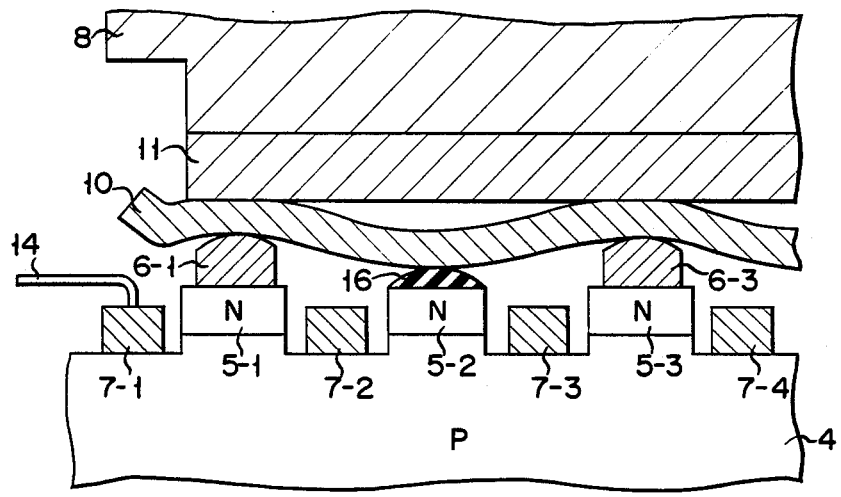
FIG. 6 is a cross sectional view of a device of another example obtained by modifying the device of FIG. 1 so as to solve the problem indicated in FIG. 3.

FIG. 6 shows another example of the structure for preventing the defect shown in FIG. 3. In FIG. 6, insulation material 16 is formed on emitter region 5-2 having emitter electrode 6-2 removed. Polyimide is used as insulation material 16, for example. After polyimide is coated on emitter region 5-2, heat treatment is effected to cure the same. When cured by the heat treatment, polyimide shrinks. Even when polyimide is coated higher than emitter electrodes 6-1, 6-3, ..., it becomes lower when it is subjected to heat treatment. Thus, even if soft metal plate 10 is largely curved when emitter electrodes 6-1, 6-3, ... are press-contact, no problem will occur.

With the construction described above, defect due to the contact of curved soft metal plate with the defective segment (emitter region 5-2) can be prevented.

Figure 7:
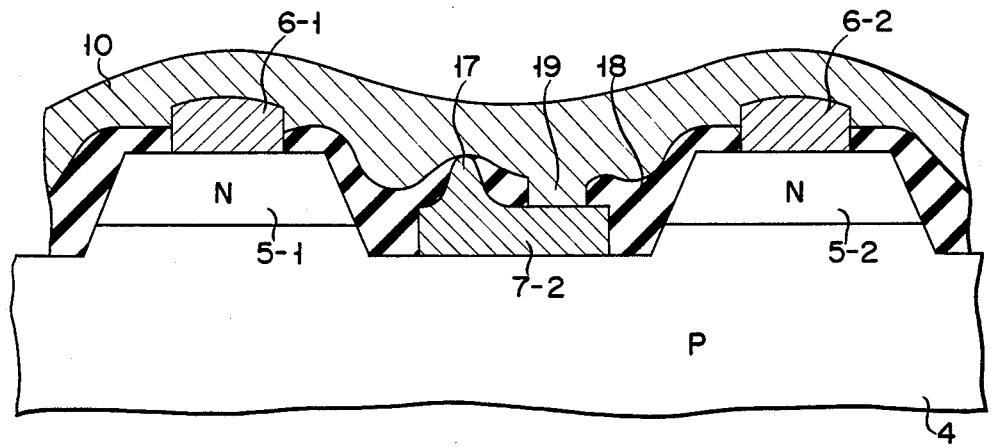
FIG. 7 is a cross sectional view for illustration of another problem which may occur when the device of the structure shown in FIG. 1 is used.

In the semiconductor device, a hillock may occur in the electrode of the semiconductor element, and a defect called pin hole may occur in the insulation film formed on the semiconductor element. FIG. 7 indicates the case where hillock 17 occurs in base electrode 7-2, and pin hole 19 occurs in insulation film 18 formed for surface protection of the transistor element. When a hillock occurs as shown in FIG. 7, hillock 17 will be brought into contact with soft metal plate 10 to cause short circuit between emitter electrodes 6-1, 6-2, ... and base electrodes 7-2. Further, if pin hole 19 occurs, soft metal plate 10 will become in contact with base electrode 7-2 via pin hole 19, causing short circuit between emitter electrodes 6-1, 6-2, ... and base electrode 7-2.

Figure 8:
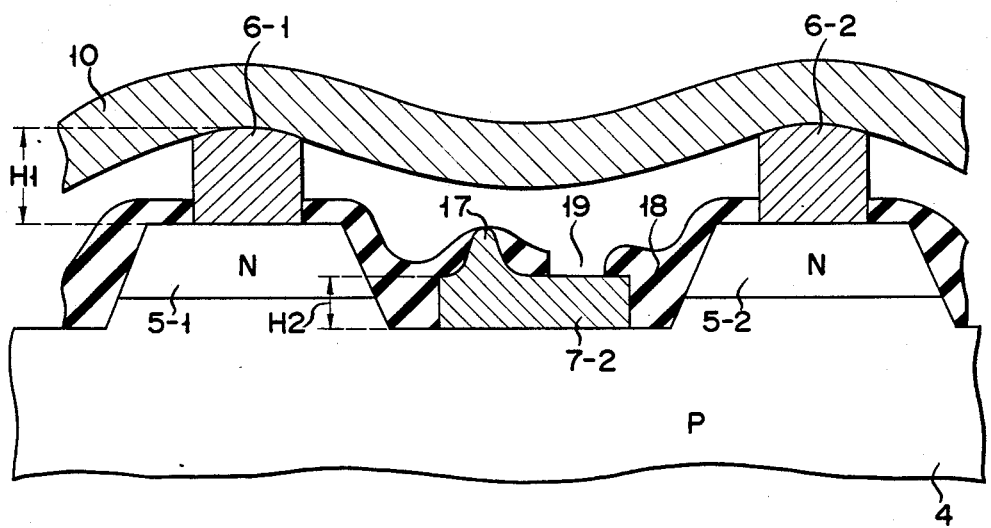
FIG. 8 is a cross sectional view of a device of one example obtained by modifying the device of FIG. 1 so as to solve the problem indicated in FIG. 7.

In order to prevent such defects as described above, thickness H1 of emitter electrodes 6-1, 6-2, ... is set larger than thickness H2 of base electrode 7-2 as shown in FIG. 8.

With this construction, even if hillock 17 occurs in base electrode 7-2 or pin hole 19 is formed in insulation film 18 formed for surface protection of the transistor element, it will be difficult for the curved portion of soft metal plate 10 to reach hillock 17 and pin hole 19. Thus, contact between hillock 17 and soft metal plate 10 and contact of soft metal plate 10 with base electrode 7-2 via pin hole 19 can be prevented. Further, the construction is effective to prevent contact between emitter electrode 5-2 and soft metal plate 10 due to curved soft metal plate 10 shown in FIG. 3.

In the embodiments described above, a case where the semiconductor device is a flat type power transistor is explained, but the same effect can be attained when the semiconductor device is formed as a different type of semiconductor element such as gate turn-off thyristor or high-speed thyristor.

As described above, according to this invention, a press-contact type semiconductor device is provided in which defect due to thermal fatigue of the electrode of the semiconductor element can be prevented.

What is claimed is:

1. A press-contact type semiconductor device having at least one semiconductor element sandwiched between electrodes to which external pressure is applied, and comprising:
   a semiconductor element having a mesa structure and including extraction electrodes;
   a casing in which said semiconductor element is arranged;
   external electrodes arranged to sandwich and press-contact said semiconductor element placed in said casing; and
   a composite plate comprising a soft metal plate and a hard metal plate, both interposed between one of said external electrodes and said semiconductor element, said soft metal plate contacting said extraction electrodes, said hard metal plate interposed between said soft metal plate and said one of said extraction electrodes, and said soft metal plate being 5 to 20 times thicker than said extraction electrodes and one-eighth to one-twentieth the thickness of said hard metal plate.

2. A press-contact type semiconductor device according to claim 1, wherein said soft metal plate has substantially equal hardness as said external electrodes.

3. A press-contact type semiconductor device according to claim 2, wherein said soft metal plate has a Vickers hardness which ranges from 0.3 time to 1.5 times the Vickers hardness of said extraction electrodes of said semiconductor element.

4. A press-contact type semiconductor device according to claim 3, wherein said extraction electrodes of said semiconductor element are formed of aluminum, said soft metal plate is formed of metal selected from a group consisting of aluminum, silver and copper.

5. A press-contact type semiconductor device according to claim 1, wherein said semiconductor element further includes first extraction electrodes press-contact via said composite plate by means of one of said external electrodes, and second extraction electrodes disposed in a position lower than said first extraction electrodes so as not to be press-contacted by means of said external electrode, and said first extraction electrodes are formed thicker than said second extraction electrodes.

6. A press-contact type semiconductor device according to claim 1, wherein said semiconductor element further includes an insulation material thinner than said extraction electrodes coated on a semiconductor region which is exposed by removing part of said extraction electrodes.

7. A press-contact type semiconductor device according to claim 6, wherein said insulation material is heat-shrinkable.

8. A press-contact type semiconductor device according to claim 7, wherein said heat-shrinkable insulation material is polyimide.

9. A press-contact type semiconductor device according to claim 1, wherein said extraction electrodes have a thickness on the order of 10 to 15 microns, said soft metal plate has a thickness on the order of 50 to 200 microns, and said hard metal plate has a thickness on the order of 400 microns to 1 millimeter.

10. A press-contact type semiconductor device having at least one semiconductor element sandwiched between electrodes to which external pressure is applied, and comprising:
    a semiconductor element having a mesa structure and including extraction electrodes;
    a casing in which said semiconductor element is arranged;
    external electrodes arranged to sandwich and press-contact contact said semiconductor element placed in said casing; and
    a composite plate comprising a thin hard metal plate, a soft metal plate, and a hard metal plate, all interposed between one of said external electrodes and said semiconductor element, said thin hard metal plate contacting said external electrodes, said soft metal plate interposed between said thin hard metal plate and said soft metal plate, and said thin hard metal plate being thinner than said soft metal plate and thicker than said external electrodes, and said soft metal plate being 5 to 20 times thicker than said external electrodes and one-eighth to one-twentieth the thickness of said hard metal plate.

11. A press-contact type semiconductor device according to claim 10, wherein said soft metal plate has substantially equal hardness as said external electrodes.

12. A press-contact type semiconductor device according to claim 11, wherein said soft metal plate has a Vickers hardness which ranges from 0.3 time to 1.5 times the Vickers hardness of said external electrodes of said semiconductor element.

13. A press-contact type semiconductor device according to claim 12, wherein said external electrodes of said semiconductor elements are formed of aluminum, said soft metal plate is formed of metal selected from a group consisting of aluminum, silver and copper.

14. A press-contact type semiconductor device according to claim 10, wherein said semiconductor element further includes first extraction electrodes press-contact via said composite plate by means of said external electrode, and second extraction electrodes disposed in a position lower than said first extraction electrodes so as not to be press-contacted by means of one of said external electrodes, and said first extraction electrodes are formed thicker than said second extraction electrodes.

15. A press-contact type semiconductor device according to claim 10, wherein said semiconductor element further includes an insulation material thinner than said extraction electrodes disposed on a semiconductor region which is exposed by removing part of said extraction electrodes.

16. A press-contact type semiconductor device according to claim 15, wherein said insulation material is heat-shrinkable.

17. A press-contact type semiconductor device according to claim 16 wherein said heat-shrinkable insulation material is polyimide.

18. A press-contact type semiconductor device according to claim 10, wherein said external electrodes have a thickness on the order of 10 to 15 microns, said thin hard metal plate has a thickness of substantially 50 microns, said soft metal plate has a thickness on the order of 50 to 200 microns, and said hard metal plate has a thickness on the order of 400 microns to 1 millimeter.

* * * * *